United States Patent
Hsu et al.

(10) Patent No.: US 6,812,757 B2
(45) Date of Patent: Nov. 2, 2004

(54) PHASE LOCK LOOP APPARATUS

(75) Inventors: Michael Pang-Cheng Hsu, Beaverton, OR (US); Rajendran Nair, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 102 days.

(21) Appl. No.: 10/146,689

(22) Filed: May 14, 2002

(65) Prior Publication Data

US 2002/0149432 A1 Oct. 17, 2002

Related U.S. Application Data

(62) Division of application No. 09/735,858, filed on Dec. 13, 2000, now Pat. No. 6,420,912.

(51) Int. Cl.[7] .................................................. H03L 7/06
(52) U.S. Cl. ........................ 327/158; 327/101; 327/65; 327/112
(58) Field of Search ................................ 327/101, 103, 327/147, 148, 149, 156, 157, 158, 65, 112; 331/17; 375/373, 375

(56) References Cited

U.S. PATENT DOCUMENTS

| | | | | |
|---|---|---|---|---|
| 4,929,851 A | | 5/1990 | Pace ........................... 307/359 |
| 5,252,865 A | * | 10/1993 | Davenport et al. ............. 327/3 |
| 5,343,167 A | * | 8/1994 | Masumoto et al. ............. 331/2 |
| 5,422,603 A | * | 6/1995 | Soyuer ........................ 331/1 A |
| 5,477,193 A | * | 12/1995 | Burchfield ..................... 331/8 |
| 5,515,012 A | * | 5/1996 | Bhushan et al. ............... 331/17 |
| 5,519,309 A | | 5/1996 | Smith .......................... 323/316 |
| 5,745,007 A | | 4/1998 | Redman-White ........... 330/253 |
| 6,054,874 A | | 4/2000 | Sculley et al. ................ 326/83 |
| 6,107,858 A | | 8/2000 | Kimura ....................... 327/349 |
| 6,275,073 B1 | | 8/2001 | Tokuhiro ...................... 327/66 |
| 6,281,712 B1 | * | 8/2001 | Martin et al. .................. 327/3 |
| 6,300,803 B1 | * | 10/2001 | Matsui .......................... 327/3 |
| 6,317,476 B1 | * | 11/2001 | Oishi et al. .................. 375/371 |
| 6,549,599 B2 | * | 4/2003 | Momtaz ..................... 375/376 |
| 2002/0018535 A1 | * | 2/2002 | Hairapetian et al. ........ 375/376 |

OTHER PUBLICATIONS

Huang, S..C. ,et al. , "Linear Tunable Comfet Transconductor", *Electronics Letter*. (Mar. 4, 1993), 459–461.

Johansson, Henrik.O. , "A Simple Precharged CMOS Phase Frequency Detector", *IEEE Journal of Solid–State Circuits, 33*(2), (Feb. 1998),pp. 295–299.

Young, Ian.A. , et al. , "A PLL Clock Generator with 5 to 110 MHz of Lock Range for Microprocessors", *IEEE Journal of Solid–State Circuits, vol. 27*, (Nov. 1992), 1599–1607.

* cited by examiner

*Primary Examiner*—Terry D. Cunningham
(74) *Attorney, Agent, or Firm*—Schwegman, Lundberg, Woessner & Kluth, P.A.

(57) ABSTRACT

A phase lock loop circuit including a voltage controlled oscillator and a phase detector having a sampling circuit and a linear voltage-to-current converter to create a control voltage for the voltage controlled oscillator. The phase lock loop circuit comprising a voltage-to-current circuit to influence a voltage on a capacitor, the voltage controlled oscillator responsive to the voltage on the capacitor, and the sampling circuit responsive to the first and second clock signals to generate two voltage values.

12 Claims, 7 Drawing Sheets

Fig. 7

PHASE LOCK LOOP APPARATUS

This application is a divisional of application U.S. Ser. No. 09/735,858, filed on Dec. 13, 2000 now U.S. Pat. No. 6,420,912.

FIELD

The present invention relates generally to voltage-to-current converters, and more specifically to linear voltage-to-current converters.

BACKGROUND

Phase lock loop (PLL) circuits and delay lock loop (DLL) circuits are commonly used in integrated circuits today. Example uses for these circuits include clock recovery in communications systems and clock signal alignment in digital systems.

PLLs and DLLs often incorporate a phase detector and a voltage controlled oscillator (VCO). The VCO generates an output signal with a phase and frequency that is a function of a control voltage. The phase detector measures the phase difference between an input signal and the output signal, and adjusts the control voltage of the VCO. The control voltage to the VCO represents a phase difference, or "phase error" between the input signal and the output signal. When the phase error is large enough, the VCO changes the phase or frequency of the output signal to more closely match that of the input signal.

Examples of PLLs, DLLs, VCOs, and phase detectors are described in: Ian A. Young, Jeffrey K. Greason, and Keng L. Wong, "A PLL Clock Generator with 5 to 110 MHz of Lock Range for Microprocessors," IEEE Journal of Solid-State Circuits, pp. 1599–1607, Vol. 27, No. 11, Nov. 1992; and Henrik O. Johansson, "A Simple Precharged CMOS Phase Frequency Detector," IEEE Journal of Solid-State Circuits, pp. 295–299, Vol. 33, No. 2, Feb. 1998.

The phase detectors described in the above references exhibit a "dead zone" in the phase characteristic at the equilibrium point under certain conditions. The dead zone generates phase jitter in part because the VCO does not change the phase of the output signal when the phase error is within the dead zone. As the operating frequency of integrated circuits increases, PLLs, DLLs, and their associated VCOs and phase detectors are also operating faster, and the size of the dead zone becomes an important factor in the design of circuits.

For the reasons stated above, and for other reasons stated below which will become apparent to those skilled in the art upon reading and understanding the present specification, there is a need in the art for alternate phase detectors and circuits that incorporate phase detectors.

DESCRIPTION OF EMBODIMENTS

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to convert a voltage to a current. Some embodiments combine the voltage-to-current circuit with a sampling circuit to implement a phase detector circuit. Two polarities of a differential signal are sampled, and the voltage difference between the two polarities of the differential signal is input to the voltage-to-current circuit. The voltage-to-current circuit is a linear circuit that combines two complementary voltage-to-current circuits with a common gate output stage.

Figure 1:
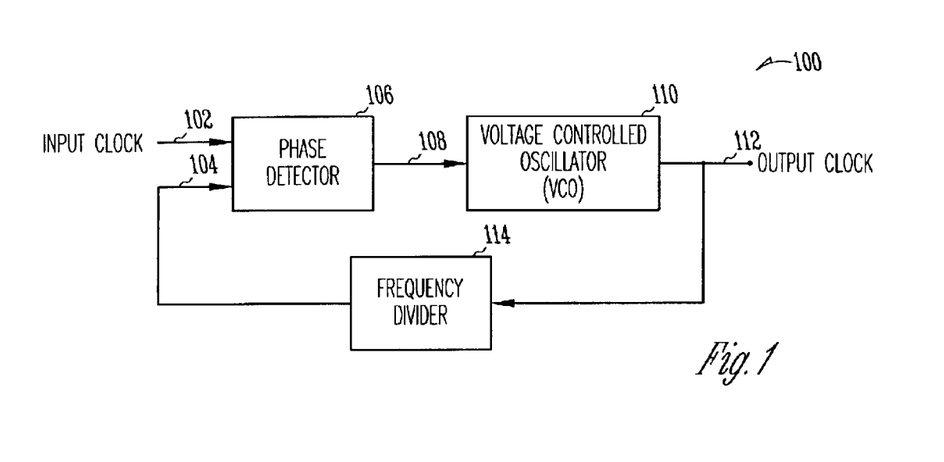
FIG. 1 shows a phase lock loop.

FIG. 1 shows a phase lock loop (PLL). PLL 100 includes phase detector 106, voltage controlled oscillator (VCO) 110, and frequency divider 114. Phase detector 106 receives an input clock signal on node 102, and also receives a clock signal on node 104. Phase detector 106 measures a phase difference between signals on nodes 102 and 104, and generates a voltage on node 108 that is a function of the phase difference. VCO 110 receives the voltage on node 108, and produces an output clock signal on node 112.

Signals on nodes 102 and 104 can be either single-ended or differential signals. For example, the input clock signal on node 102 can include a single signal, or two signals that are complements of each other. Likewise, the signal on node 104 can include a single signal, or two signals that are complements of each other. When a node carries a differential signal, that node includes multiple physical signal traces. For example, in embodiments where the input clock signal is a differential signal, node 102 includes two physical signal traces to carry the differential signals. In some embodiments, VCO 110 produces a differential clock signal on node 112, and frequency divider 114 produces a differential signal on node 104.

In some embodiments, VCO 110 produces an output clock signal on node 112 that has a frequency other than the frequency of the input clock signal on node 102. For example, in some embodiments, PLL 100 is included in a microprocessor having an internal operating frequency higher than an external clock frequency. In these embodiments, PLL 100 can generate an output clock signal at a greater frequency than an input clock signal, but with matching phase.

In the embodiment shown in FIG. 1, VCO 110 produces an output clock signal having a frequency higher than the input clock frequency, and frequency divider 114 divides the output clock signal on node 112 to produce a frequency divided signal on node 104. In other embodiments, VCO 110 produces an output clock signal at the same frequency as the input clock signal, and frequency divider 114 is not included in PLL 100. For ease of explanation, the remainder of this description describes PLLs, phase detectors, and other circuits operating with signals of the same frequency.

Figure 2:
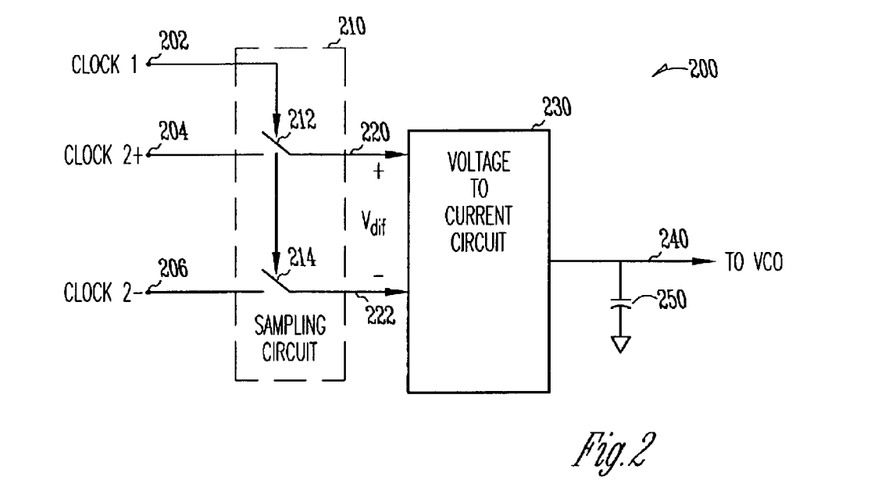
FIG. 2 shows a phase detector.

FIG. 2 shows a phase detector. Phase detector 200 includes sampling circuit 210, voltage-to-current circuit 230, and capacitor 250. Sampling circuit 210 includes switches 212 and 214 controlled by a signal on node 202. In the embodiment of FIG. 2, the signal on node 202 is labeled "CLOCK1." CLOCK1 is one of two signals input to sampling circuit 210. The other signal input to sampling circuit 210 is a differential signal consisting of two physical signals received on nodes 204 and 206 that are labeled "CLOCK2+" and CLOCK2−," respectively. Taken together, CLOCK2+ and CLOCK2− represent a single signal represented by the label "CLOCK2."

CLOCK1 and CLOCK2 correspond to signals on nodes 102 and 104 in FIG. 1. For example, in some embodiments, CLOCK1 corresponds to the input clock signal on node 102 (FIG. 1), and CLOCK2 corresponds to the clock signal on node 104 (FIG. 1). In these embodiments, frequency divider 114 (FIG. 1) produces a differential signal on node 104. In other embodiments, CLOCK2 corresponds to the input clock signal on node 102, and CLOCK1 corresponds to the clock signal on node 104. In these embodiments, the input clock signal received on node 102 is a differential signal.

Sampling circuit 210 samples voltage values of differential signal CLOCK2 at transition points of CLOCK1, and produces a voltage differential ($V_{dif}$) between nodes 220 and 222. $V_{dif}$ represents a phase error between CLOCK1 and CLOCK2. Sampling circuit 210 can be implemented using known techniques for sampling signals.

Voltage-to-current circuit 230 receives $V_{dif}$ on nodes 220 and 222 and produces a current on node 240. The current on node 240 charges and discharges capacitor 250 to produce a voltage for controlling a VCO, such as VCO 110 (FIG. 1). Voltage-to-current circuit 230 is a linear circuit that produces a current on node 240 without a dead zone, or with a very small dead zone. When $V_{dif}$ is positive, voltage-to-current circuit 230 sources an output current to charge capacitor 250 to a higher voltage. In contrast, when $V_{dif}$ is negative, voltage-to-current circuit 230 sinks an output current to discharge capacitor 250 to a lower voltage.

Figure 3:
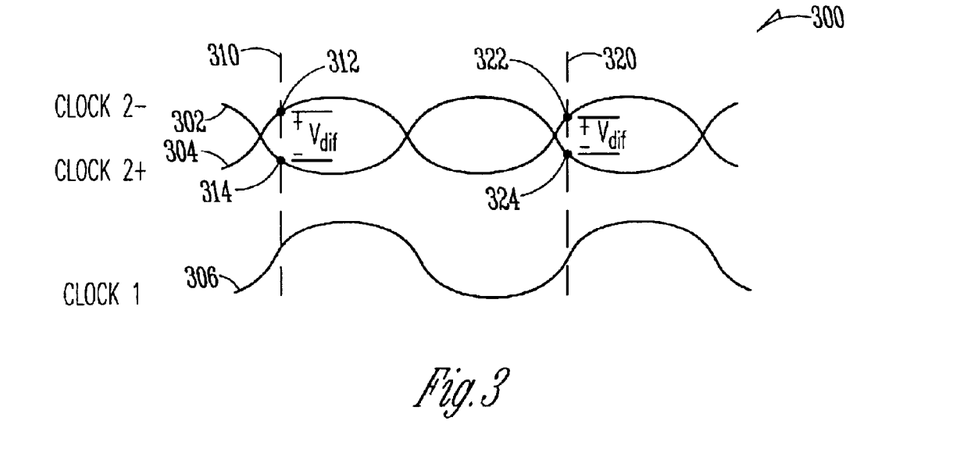
FIG. 3 shows sampling circuit waveforms.

FIG. 3 shows sampling circuit waveforms for signals CLOCK1 and CLOCK2 of FIG. 2. CLOCK1 is represented by waveform 306, CLOCK2+ is represented by waveform 304, and CLOCK2− is represented by waveform 302. CLOCK2+ and CLOCK2− are sampled at transition points of CLOCK1. This is shown at times 310 and 320 in FIG. 3. In the embodiment of FIG. 3, the transition point is the rising edge of CLOCK1. In other embodiments, the transition is the falling edge of CLOCK1.

At time 310, CLOCK2 is sampled and $V_{dif}$ exists between points 312 and 314. At time 320, CLOCK2 is again sampled and $V_{dif}$ exists between points 322 and 324. As a result of $V_{dif}$, voltage-to-current circuit 230 (FIG. 2) changes a control voltage for a VCO, which in turn modifies the phase of either CLOCK1 or CLOCK2 to reduce the phase error.

Figure 4:
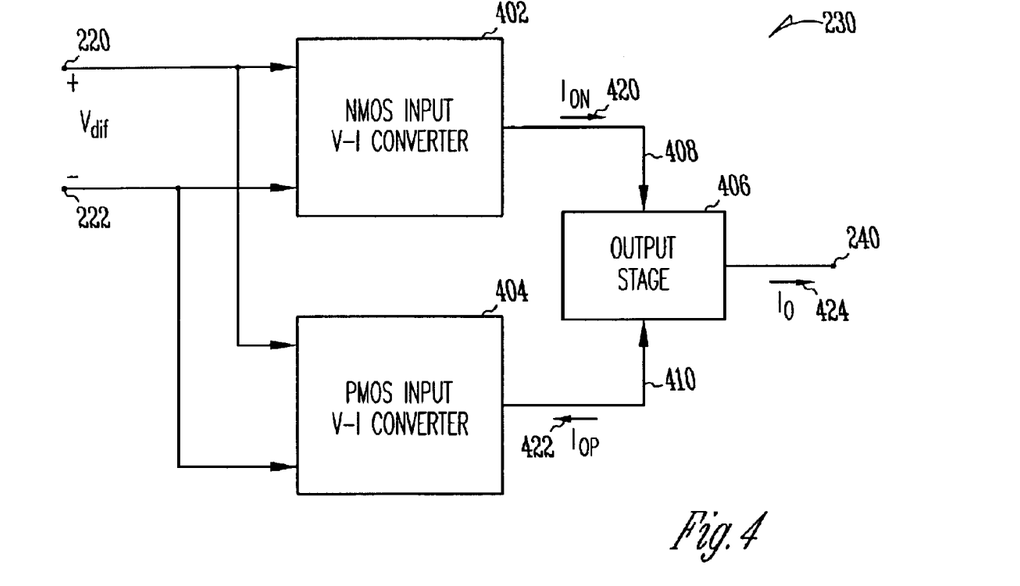
FIG. 4 shows a block diagram of a voltage-to-current circuit.

FIG. 4 shows a block diagram of a voltage-to-current circuit. Voltage-to-current circuit 230 includes NMOS-input voltage-to-current (V-I) converter 402, PMOS-input V-I converter 404, and output stage 406. Both NMOS-input V-I converter 402 and PMOS-input V-I converter 404 receive $V_{dif}$ on nodes 220 and 222. When $V_{dif}$ is positive, NMOS-input V-I converter 402 sources current 420 on node 408, and PMOS-input V-I converter 404 does not contribute to the output current. Current 420 is labeled $I_{ON}$ in FIG. 4. When $V_{dif}$ is negative, NMOS-input V-I converter 402 does not contribute to the output current, and PMOS-input V-I converter 404 sinks current 422 on node 410. Current 422 is labeled $I_{OP}$ in FIG. 4.

Output stage 406 combines currents 420 and 422 to produce output current 424, labeled $I_O$ in FIG. 4. Output stage 406 also reduces the sensitivity of the output current for different output voltages.

Figure 5:
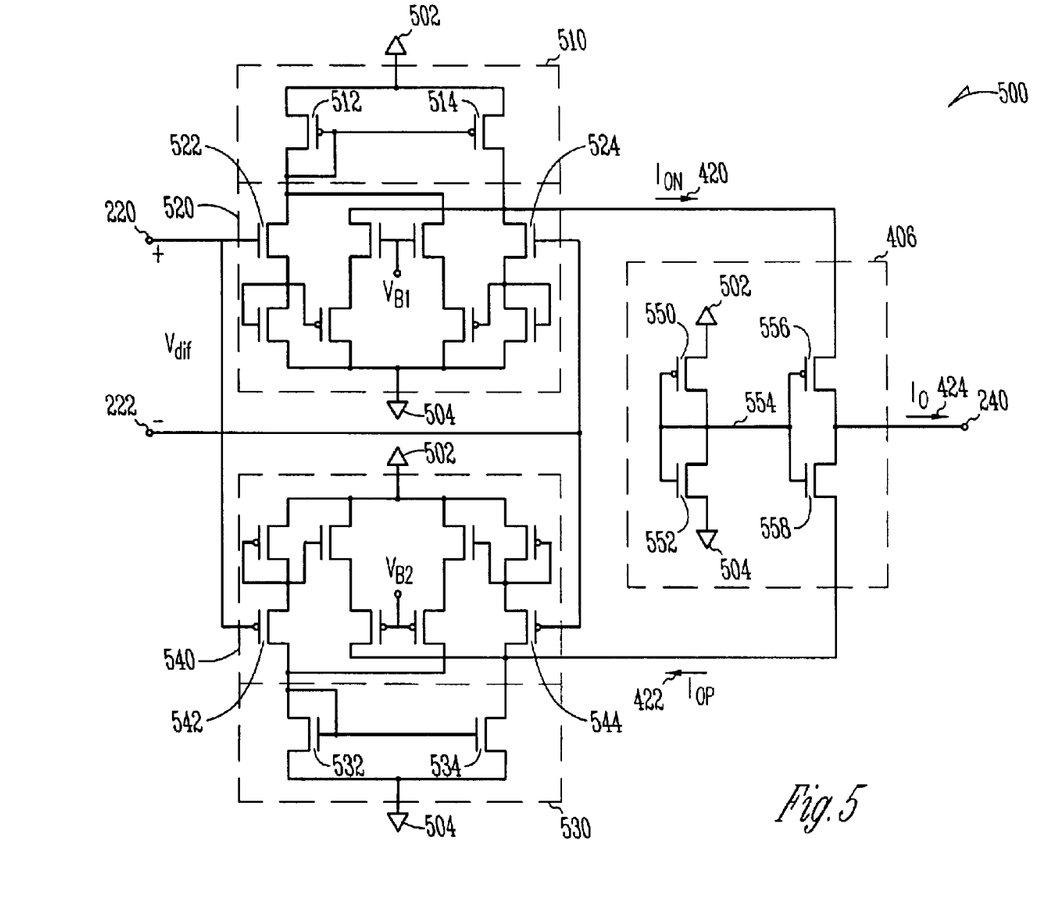
FIG. 5 shows a circuit diagram of a voltage-to-current circuit.

FIG. 5 shows a circuit diagram of a voltage-to-current (V-I) circuit. V-I circuit 500 includes transconductance amplifiers 520 and 540, current mirrors 510 and 530, and output stage 406. Transconductance amplifier 520 and current mirror 510, taken together, represent one embodiment of NMOS-input V-I converter 402 (FIG. 4). Likewise, transconductance amplifier 540 and current mirror 530, taken together, represent one embodiment of PMOS-input V-I converter 404 (FIG. 4). Each of these circuits is coupled between upper power supply node 502 and lower power supply node 504.

Transconductance amplifier 520 includes n-channel input transistors 522 and 524. N-channel input transistors 522 and 524 are shown as n-channel metal oxide semiconductor field effect transistors (MOSFETs), and represent any type of transistor having an n-type channel. The terms "NMOS" and "n-channel" are used herein to describe such a transistor. Likewise, the terms "PMOS" and "p-channel" are used herein to describe transistors having p-type channels. Transconductance amplifiers of the type shown as transconductance amplifier 520 in FIG. 5 are described in: S. C. Huang and M. Ismail, "Linear Tunable COMFET Transconductor," Electronics Letters, pp. 459–461, Vol. 29, No. 5, Mar. 1993. Transconductance amplifiers 520 and 540 include bias nodes to receive bias voltages VB1 and VB2, respectively. In some embodiments, VB1 and VB2 are adjustable control voltages of the V-I converters to reduce process, temperature, and power supply variations.

Current mirror 510 includes p-channel transistors 512 and 514. P-channel transistor 512 is diode connected, and has a gate coupled to the gate of p-channel transistor 514. The source-to-drain current in transistors 512 and 514 is, therefore, substantially equal. As $V_{dif}$ changes, the gate voltage on n-channel transistors 522 and 524 also changes. As the gate voltage changes, the drain-to-source current in transistors 522 and 524 changes. The constant current in current mirror 510, and the varying currents in the n-channel input transistors of transconductance amplifier 520 result in a varying current 420. When $V_{dif}$ is positive, current 420 flows in the direction of the arrow shown in FIG. 5. When $V_{dif}$ is negative, current 420 does not flow. This is due in part to the operation of output stage 406, discussed in more detail below.

Transconductance amplifier 540 is a complementary version of transconductance amplifier 520. Transconductance amplifier 540 includes p-channel input transistors 542 and 544. Current mirror 530 includes n-channel transistors 532 and 534. N-channel transistor 532 is a diode connected transistor having a gate coupled in common with a gate of n-channel transistor 534. As a result, drain-to-source currents in transistors 532 and 534 are substantially equal. As $V_{dif}$ on nodes 220 and 222 varies, so does the source-to-drain current in p-channel input transistors 542 and 544. As a result, current 422 is produced. When $V_{dif}$ is negative, current 422 flows in the direction shown by the arrow in FIG. 5. When $V_{dif}$ is positive, current 422 does not flow, in part because of the operation of output stage 406.

Output stage 406 is a common gate output stage having two pairs of complementary transistors with gates coupled in common. For example, p-channel transistor 556 and n-channel transistor 558 form a series connected complementary pair coupled between the output node of the NMOS-input V-I converter and the output node of the PMOS-input V-I converter. A junction between transistors 556 and 558 forms output node 240 of V-I converter 500. P-channel transistor 550 and n-channel transistor 552 form a series connected complementary pair of transistor coupled between the upper power supply node and the lower power supply node. Gates of transistors within output stage 406 are all coupled in common with node 554 formed at the junction between p-channel transistor 550 and n-channel transistor 552. In this manner, transistors 550 and 552 form a bias circuit to provide a gate bias for transistors 556 and 558. In other embodiments, different bias circuits are used to bias transistors 556 and 558.

In operation, when $V_{dif}$ is positive, p-channel transistor 556 is on and n-channel transistor 558 is off. This allows current 420 to flow as current 424 on output node 240. When $V_{dif}$ is negative, n-channel transistor 558 is on and p-channel transistor 556 is off, allowing current 424 to flow in the direction opposite the arrow shown in FIG. 5 to discharge any capacitance on output node 240. V-I converter 500 has been simulated in a 0.16 micron CMOS process. Graphical results from the simulation are shown and described with reference to FIGS. 6A–6C.

Figure 6A:
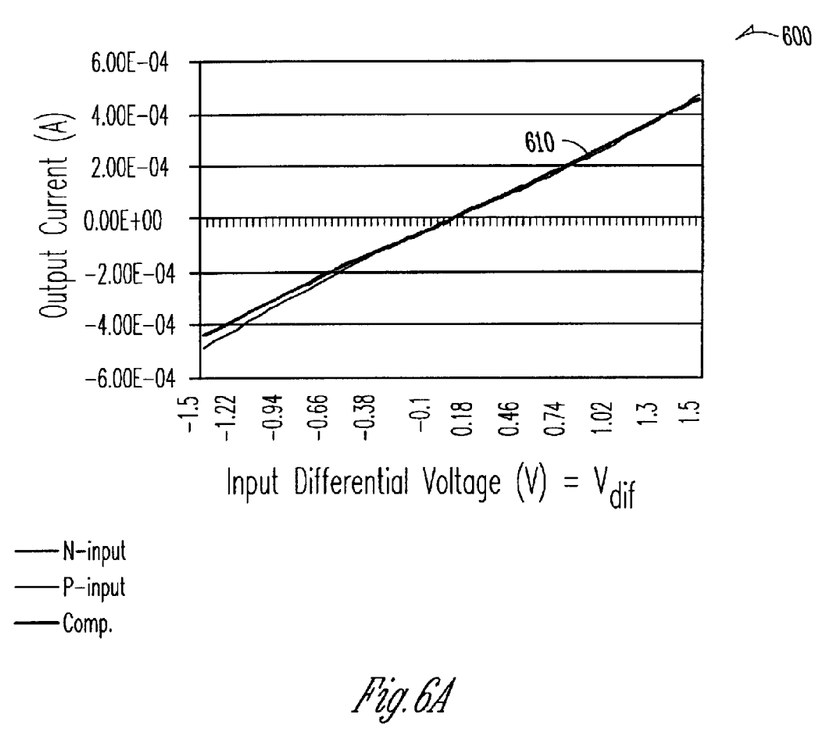
FIGS. 6A–6C show graphical results of a simulation of the circuit of FIG. 5.

FIGS. 6A–6C show graphical results of a simulation of the circuit of FIG. 5. FIG. 6A shows output current 424 (FIG. 5) as a function of input differential voltage $V_{dif}$. Graph 600 shows the differential mode gain at curve 610. Curve 610 represents the differential mode gain of V-I converter 500, as well as the individual differential mode gains of the NMOS-input and PMOS-input converters without output stage 406. The output current various substantially monotonically from −0.44 to 0.44 mA as the input differential voltage increases from −1.5 volts to 1.5 volts. The output current of V-I converter 500 (FIG. 5) utilizes the NMOS-input V-I converter while the input differential voltage is positive, and utilizes the PMOS-input V-I converter while the input differential voltage is negative. This complementary operation exhibits a large input differential voltage range, which can be applied to any circuit that can benefit from a large, linear, V-I relationship.

Figure 6B:
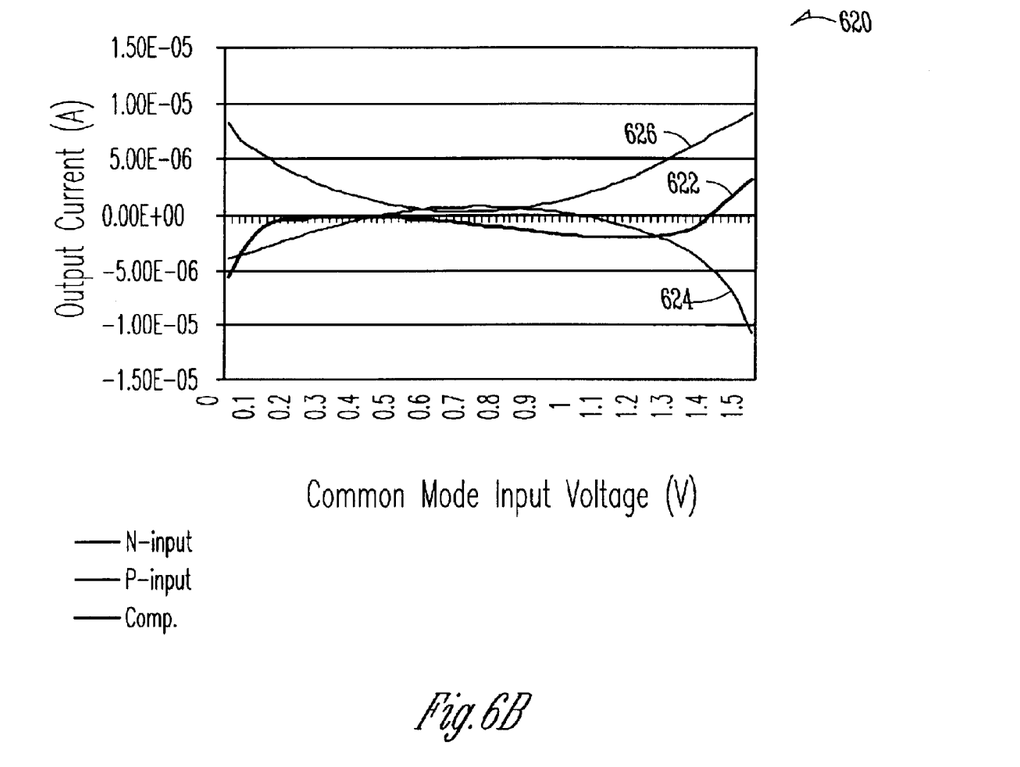

FIG. 6B shows output current 424 (FIG. 5) as a function of input common mode voltage. Graph 620 shows curves 622, 624, and 626. Curve 622 represents output current 424 of V-I converter 500. Curves 624 and 626 represent the output currents of the NMOS-input and PMOS-input V-I converters, respectively, when operating without each other and without output stage 406. Output current 424 varies within −6 uA to 4 uA as the two input signals increase from 0 volts to 1.5 volts, as shown by curve 622. This common mode variation is generally smaller than variations of the individual NMOS-input and PMOS-input V-I converters. This is shown by the contrast between curves 622 and 624, and also by the contrast between curves 622 and 626.

Figure 6C:
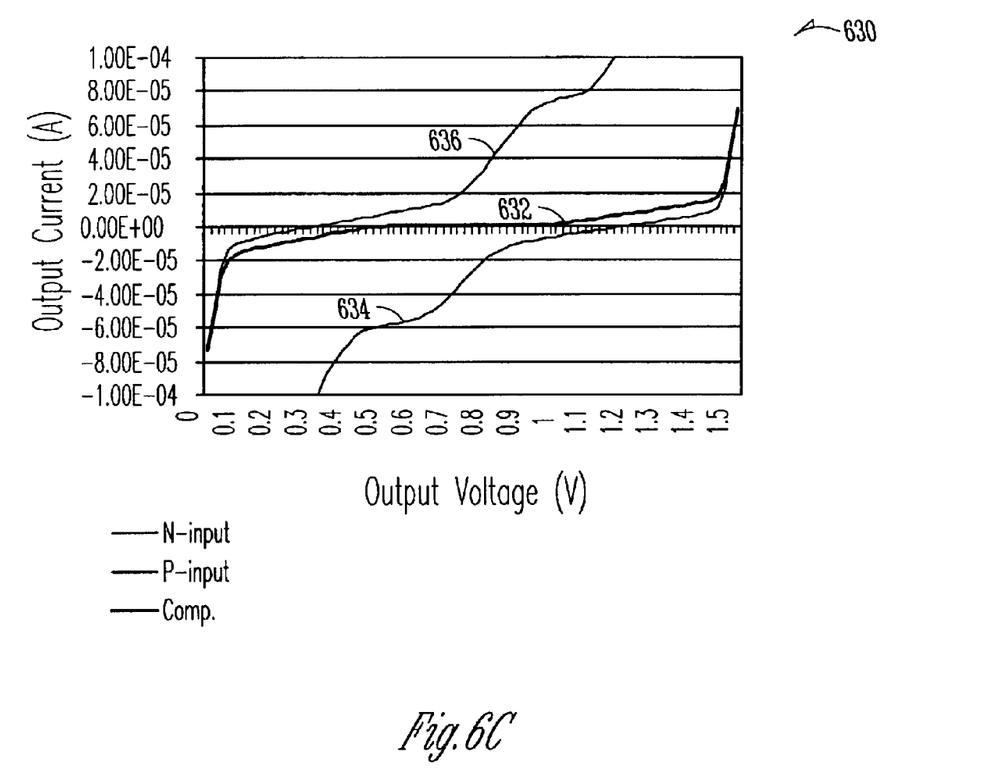

FIG. 6C shows the effect of the output voltage on the output current. Graph 630 shows curves 632, 634, and 636. Curve 632 represents output current 424 (FIG. 5) of V-I converter 500. Curves 634 and 636 represent the output currents of the NMOS-input and PMOS-input V-I converters, respectively, when operating without each other and without output stage 406. The data for curve 632 was generated with $V_{dif}$ set to zero, and each of input nodes 220 and 222 biased at 0.75 volts. Output current 424 is close to zero when the output voltage is in the range of 0.5 volts to 1.0 volts. This is in contrast to the behavior of the NMOS-input and PMOS-input V-I converters operating without output stage 406. This is shown by the contrast between curves 632 and 634, and also by the contrast between curves 632 and 636.

Figure 7:
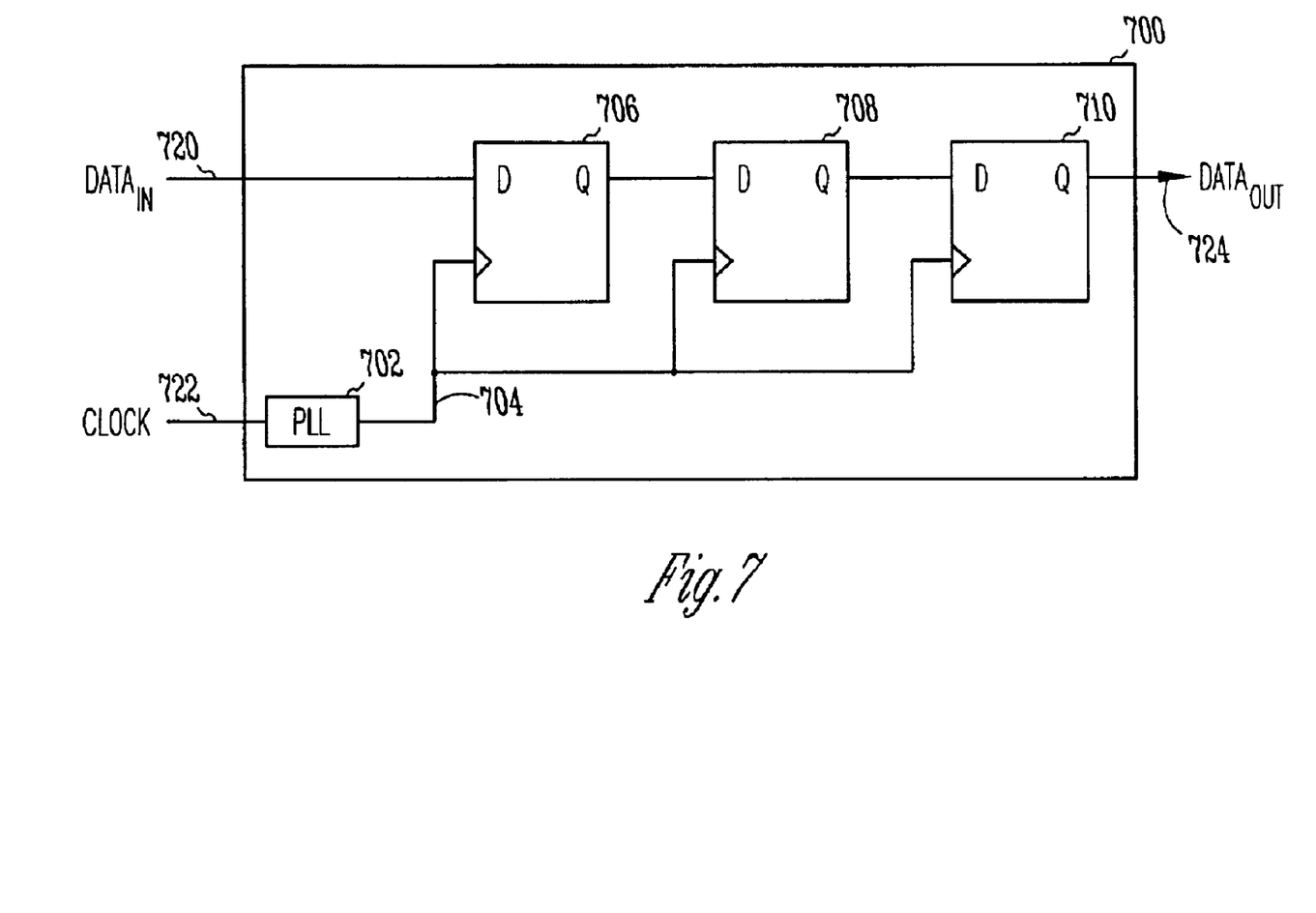
FIG. 7 shows an integrated circuit having a phase lock loop.

FIG. 7 shows an integrated circuit having a phase lock loop. Integrated circuit 700 includes PLL 702 and sequential elements 706, 708, and 710. PLL 702 receives an external clock on node 722 and produces an internal clock on node 704. PLL 702 can be any PLL embodiment of the present invention. For example, PLL 702 can incorporate phase detector 200 (FIG. 2), and V-I circuit 500 (FIG. 5). Sequential elements 706, 708, and 710 are shown as D-type flip-flops clocked by the internal clock on node 704, but this is not a limitation of the present invention. For example, PLL 702 can create a clock signal that drives latches, flip-flops other than D-type flip-flops, or any other type of sequential element.

Sequential element 706 receives external data from node 720, and sequential element 710 drives external data on node 724. PLL 702 substantially aligns the phase of the clocks on nodes 722 and 704 such that data on node 720 is received properly by sequential element 706.

Integrated circuit 700 is shown having a phase lock loop generating a clock to operate digital circuits. This can be useful in many different types of digital integrated circuits. Examples include, but are not limited to, processors such as microprocessors and digital signal processors, microcontrollers, sequential memories incorporating static random access memory (SRAM) or dynamic random access memory (DRAM), or the like. Integrated circuit 700 can also be an analog integrated circuit, such as a communications device that utilizes PLL 702 to recover a clock from data.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit including a phase lock loop circuit to reduce a phase difference between first and second clock signals, the phase lock loop circuit comprising:
    a voltage-to-current circuit to influence a voltage on a capacitor, wherein the voltage-to-current circuit comprises:
        a first transconductance amplifier to source a first current when a positive voltage differential exists between the two voltage values;
        a second transconductance amplifier to sink a second current when a negative voltage differential exists between the two voltage values; and
        an output stage coupled between the first transconductance amplifier and the capacitor, and coupled between the second transconductance amplifier and the capacitor;
    a voltage controlled oscillator responsive to the voltage on the capacitor to produce the second clock signal; and
    a sampling circuit responsive to the first and second clock signals to generate two voltage values, a difference of the two voltage values being a function of the phase difference between the first and second clock signals, wherein the first transconductance amplifier comprises:
        a first input stage having n-channel transistors with gates to receive the two voltage values; and a first current mirror coupled to the n-channel transistors, such that the first current is substantially equal to a difference between a current in the first current mirror and a current in the first input stage.

2. The integrated circuit of claim 1 wherein the output stage comprises a complementary pair of transistors coupled between the first and second transconductance amplifiers, an output node being formed at a junction between the complementary pair of transistors, the output node being coupled to the capacitor.

3. The integrated circuit of claim 2 wherein the output stage further comprises a second complementary pair of transistors coupled between a positive supply node and a negative supply node, wherein gates of the first pair of complementary transistors are coupled in common with gates of the second pair of complementary transistors.

4. A phase lock loop circuit comprising:
   a voltage controlled oscillator to generate a differential signal on first and second differential nodes; and
   a linear voltage-to-current converter to create a control voltage for the voltage controlled oscillator in response to the differential signal, the linear voltage-to-current converter including:
      a first transconductance amplifier including n-channel transistors having gates coupled to be responsive to voltages sampled on the first and second differential nodes;
      a first current mirror coupled to the n-channel transistors, the first current mirror including p-channel transistors;
      a second transconductance amplifier including p-channel transistors having gates coupled to be responsive to voltages sampled on the first and second differential nodes;
      a second current mirror coupled to the p-channel transistors; and
      a common gate output stage coupled to the first and second transconductance amplifiers.

5. The phase lock loop circuit of claim 4 further comprising a sampling circuit coupled between the first and second differential nodes and the first and second transconductance amplifiers, the sampling circuit being configured to periodically sample voltage values on the first and second differential nodes in response to a clock signal.

6. The phase lock loop circuit of claim 5 wherein the sampling circuit is configured to sample the voltage values at a transition point of a received signal.

7. The phase lock loop circuit of claim 5 further comprising a frequency divider coupled to divide the frequency on the first and second differential nodes.

8. An integrated circuit including a phase lock loop circuit to reduce a phase difference between first and second clock signals, the phase lock loop circuit comprising:
   a voltage-to-current circuit to influence a voltage on a capacitor;
   a voltage controlled oscillator responsive to the voltage on the capacitor to produce the second clock signal; and
   a sampling circuit responsive to the first and second clock signals to generate two voltage values;
   wherein the voltage-to-current circuit includes:
      a first transconductance amplifier to source a first current when a positive voltage differential exists between the two voltage values, wherein the first transconductance amplifier comprises a first input stage having n-channel transistors with gates coupled to be responsive to the two voltage values, and a first current mirror coupled to the n-channel transistors, such that the first current is substantially equal to a difference between a current in the first current mirror and a current in the first input stage;
      a second transconductance amplifier to sink a second current when a negative voltage differential exists between the two voltage values; and
      an output stage coupled between the first transconductance amplifier and the capacitor, and coupled between the second transconductance amplifier and the capacitor,
   wherein the output stage comprises a first complementary pair of transistors coupled between the first and second transconductance amplifiers, the capacitor being coupled to a junction between the first complementary pair of transistors.

9. The integrated circuit of claim 8 wherein:
   the voltage controlled oscillator is configured to generate the second clock signal as a differential signal; and
   the sampling circuit is configured to sample the differential signal at transition points of the first clock signal to generate the two voltage values.

10. The integrated circuit of claim 9 wherein the output stage further comprises a second complementary pair of transistors coupled between a positive supply node and a negative supply node, wherein gates of the first pair of complementary transistors are coupled in common with gates of the second pair of complementary transistors.

11. The integrated circuit of claim 8 wherein:
   the sampling circuit is configured to receive the first clock signal as a differential signal; and
   the sampling circuit is configured to sample the differential signal at transition points of the second clock signal to generate the two voltage values.

12. The integrated circuit of claim 11 wherein the output stage further comprises a second complementary pair of transistors coupled between a positive supply node and a negative supply node, wherein gates of the first-pair of complementary transistors are coupled in common with gates of the second pair of complementary transistors.

* * * * *